Feb. 27, 1973 W. C. ERDMAN ET AL 3,718,514

REMOVAL OF PROJECTIONS ON EPITAXIAL LAYERS

Filed May 28, 1971

INVENTORS W. C. ERDMAN
P. MILLER
BY
George S. Indig
ATTORNEY 3,718,514

REMOVAL OF PROJECTIONS ON EPITAXIAL LAYERS

William Charles Erdman, Danielsville, and Paul Miller, Allentown, Pa., assignors to Bell Telephone Laboratories, Incorporated, Murray Hill and Berkeley Heights, N.J.

Filed May 28, 1971, Ser. No. 148,081
Int. Cl. H01l 7/50
U.S. Cl. 156—17 8 Claims

ABSTRACT OF THE DISCLOSURE

A method for removing projections from the surface of epitaxially-deposited semiconductor layers is described. These projections can adversely affect the results of photolithographic processing. The method involves producing an oxide layer on the surface and applying a discontinuous film to the oxide in such a manner that the discontinuities preferentially align with the projections. By means of a series of etching steps, the projections are selectively removed without affecting the integrity of the epitaxial layer.

BACKGROUND OF THE INVENTION

(1) Field of the invention

The invention relates to the processing of semiconductor devices fabricated from epitaxially-deposited layers.

(2) Description of the prior art

In the production of integrated circuits on semiconductor wafers, it is desirable that the surfaces be as flat as possible, in order to obtain fine dimensional accuracy during photolithographic contact printing of the circuitry features. However, during the epitaxial deposition of semiconductor layers onto substrates, as, for example, silicon onto silicon wafers, projections rising from the surface often occur.

On epitaxial layers, which usually range from about 1 to about 15 micrometers ($10^{-6}$ meters thick, the projections may be observed to vary from less than 1 to about 50 micrometers in height. As the ratio of the projection height to epitaxial layer thickness increases, these projections can become annoying in the manufacture of semiconductor devices. Generally, from 5 to 5000 such projections per wafer may be observed. The projections often impose a limit on the definition of small mask features that can be achieved by the use of contact printing methods, and, more importantly, the projections can also inflict cumulative scratch or fracture damage on the photomask.

Techniques have not yet been developed to ensure consistent preparation of epitaxial layers without these projections. In addition, there are no techniques currently available for the direct removal of these projections.

SUMMARY OF THE INVENTION

In accordance with the invention, a method for removing projections from epitaxially-deposited layers without substantially altering the integrity of the layer is described. The procedure is useful in the commercial production of semiconductor devices prepared on epitaxial layers; in particular, the preferred embodiment pertains to epitaxially-deposited silicon layers.

An oxide layer is first grown or deposited over the surface, and a film, which is resistant to chemical etching, is deposited over the oxide in such a manner as to be discontinuous. These discontinuities, called pinholes, have a very high probability of occurring at the sites of the projections. The oxide layer over the projections is thus exposed to chemical etching and can be stripped by such etching, while the oxide layer over the rest of the surface is substantially protected by the etchant-resist film. Following removal of the etchant-resist film, the projections are then reduced in size by etching the entire wafer in a chemical solution that etches the projections relative to the oxide.

To ensure integrity of the surface, the preferred embodiment of the invention contemplates repetition of this sequence of steps, due to the statistical nature of the generation of discontinuities. While having a high probability of occurring at the sites of projections, the discontinuities also occur at random over the rest of the surface. Repetition of the procedure in accordance with the invention prevents etching into the epitaxial layer.

DETAILED DESCRIPTION OF THE INVENTION

(1) Process for removing projections

Figure 1:
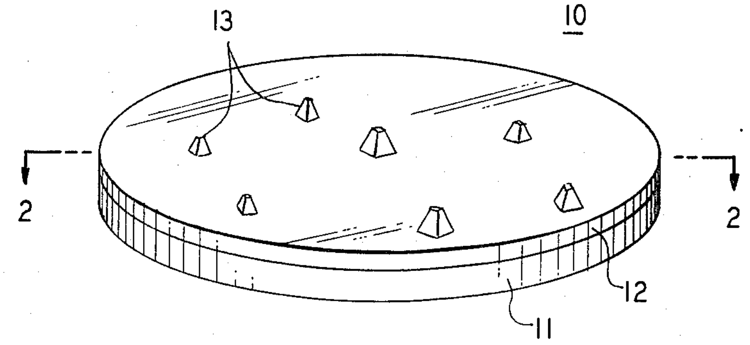
FIG. 1 is a perspective representation of the appearance of the surface of an epitaxial layer deposited on a substrate, illustrating the random distribution of projections.

Briefly, the procedure for removing projections from semiconductor layers epitaxially-deposited onto wafers utilizes the following steps: (a) oxidation of the surface of the epitaxial layer (or deposition of an oxide thereon), (b) application to the oxide of a very thin layer of a film resistant to chemical etching in such a manner as to be discontinuous, (c) removal of the oxide from the exposed projections by use of a chemical etching solution, (d) removal of the resist film by dissolution of it in a solvent, and (e) etching away of the projections by use of a second chemical etching solution that etches the projections at a much faster rate than the oxide. These steps are discussed in detail below.

(a) Oxidation of the epitaxial surface.—It is desirable for the practice of the invention to produce a layer of oxide over the epitaxial layer. The thickness of this oxide layer is constrained by two considerations: it must be enough to protect the epitaxial layer during the etching steps, yet must be thin enough so that its removal, when the inventive procedure is completed, may be done within a practical period of time.

The lower limit depends on the second chemical etchant to be used. In the silicon-silicon dioxide system, for example, an aqueous solution of potassium hydroxide will attack silicon dioxide at a rate of about 0.01 micrometer per minute and silicon at a rate of about 1.5 micrometers per minute. Assuming an average projection height of about 10 micrometers, a minimum of about 12 minutes will be required to etch the projections. Therefore, the thinnest useful layer of silicon dioxide is about 0.1 micrometer. For other etchants contemplated in accordance with the invention, this value may be reduced to about 0.05 micrometer.

The upper limit of the thickness of the oxide is about 1 micrometer, due to cracking and fracturing of the oxide.

There are many ways to produce an oxide layer on epitaxial layers. Methods well known in the art include using RF sputtering, plasma deposition, thermal deposition, and thermal oxidation. For growing an oxide layer on silicon, thermal oxidation is a convenient method. As an example of thermal oxidation, the wafer is exposed to an atmosphere of water vapor at from 1000° C. to 1100° C. for about 30 to 60 minutes. Where it is contemplated that an oxide is to be used on a system that does not itself produce a protective oxide, then silicon oxide, for example, may be used. In such a case, silicon dioxide is conveniently deposited by RF sputtering.

(b) Application of an etchant-resistant film.—The etchant-resist film can be, in general, any film that is adherent to the oxide layer, resistant to the chemical etchant used in the practice of the invention, capable of generating discontinuities, or pinholes, when applied thin enough, and easily removed. Three polymeric films that have been used with success are the cross-linkage poly(vinyl cinnamate) resins, the polyisoprene plus diazido cross-linking systems, and the polar phenolic type resins plus orthoquinone diazides. These are well-known photoresist formulations; however, the photoresist properties are not being utilized here. Rather, these formulations are used in their uncross-linked state and, moreover, are used at reduced viscosities, in contrast to well-known photoresist procedures, in order to deliberately generate discontinuities. Other etchant-resist films having the requisite properties may also be appropriately used.

The invention relies in part on the observation that the discontinuities have a high statistical probability of forming at the sites of the projections, thereby leaving the projections exposed. Accordingly, in order to generate discontinuities efficiently, a solution of the etchant-resist should have a sufficiently low viscosity so as to form discontinuous films upon complete evaporation of the solvent. Too low a viscosity, however, leads to an unacceptably high pinhole density. Useful viscosities of solutions of the etchant-resists range from 1 to 4 centipoises (viscosities of most photoresist formulations, as used in photolithography, range from about 4.5 to 15 centipoises).

Etchant-resistant coating is applied to the surface of the oxide over the epitaxial layer. Any technique that enables the practitioner to apply the resist coating uniformly to a thickness capable of generating discontinuities in the coating, such as by spinning, spraying, dipping, or the like, will suffice for the practice of the invention. One technique at these viscosities that gives the desired results with the poly(vinyl cinnamate), the polyisoprene, and orthoquinone-diazide polymers is to spin the substrate on its axis at a rate of from 5,000 ot 20,000 revolutions per minute for from 1 to 30 seconds (assuming a wafer diameter of about 30 ot 50 millimeters). Below about 5,000 revolutions per minute, the pinholes no longer tend to occur at the sites of the projections, while above about 20,000 revolutions per minute, the pinhole density would be unacceptably high. A spinning time of 1 second is a practical lower limit for spinning the wafer, while after 30 seconds of spinning, the coating is essentially dry. Drop-wise addition of a solution of these polymers is a convenient means for application to a spinning wafer.

The spinning substrate will, of course, exert some force on the photoresist solution as it is applied, causing it to spread out across the wafer to some preferred thickness. This force will depend primarily on such factors as the viscosity of the photoresist solution, its surface tension, the angular velocity of the wafer, and its diameter. However, such a force, which results in a relative motion of the photoresist solution across the wafer, can also be produced by other forms of motion in addition to a liquid solution on a spinning substrate. For example, spraying the photoresist solution across a stationary wafer, as well as other forms of like relative motion, will also serve to apply a discontinuous photoresist film in accordance with the invention, so long as the factors influencing the force producing the relative motion are considered.

The values of the viscosity of the polymeric solutions (subject to the considerations of pinhole density mentioned above), and of the relative motion of the solution across the wafer are selected so as to give a coating having a maximum thickness of 0.3 micrometer. At thicknesses less than 0.3 micrometer, the above-named polymers readily form pinholes, while at greater thicknesses, it is known that these materials do not form a substantial number of pinholes. In the application of other etchant-resist films to the oxide surface, the viscosity and the relative motion are to be selected so as to produce a pinhole density approximate to that of the projection density.

(c) Etching the oxide from the projections.—A solution that preferentially attacks the oxide is used to strip the oxide from the projections. In the case of silicon dioxide, an example of such a solution is hydrofluoric acid, buffered with ammonium fluoride to a pH of approximately 2.0; this solution etches silicon dioxide at a rate of about 0.1 micrometers per minute. The acid-resistant properties of the polymeric coating deposited in the preceding step, however, serve to protect the rest of the surface from substantial attack.

(d) Removing the polymeric film from the surface.—A dip of the substrate into a common organic solvent, such as acetone or n-butyl acetate, is sufficient to dissolve the etchant-resist film. Alternatively, the etchant-resist materials may be removed together with the projections if this step is bypassed. However, the long term use of the etching solution described in the following step for removing both the projections and the etchant-resist film will eventually lead to contamination of that solution.

(e) Etching away the projections.—At this stage in the process, the surface of epitaxially deposited layer is comprised of both an oxide covering the relatively flat portions of the surface and of number of projections, which have been stripped of oxide. Now an etchant that will preferentially attack the projections relative to oxide is used to remove the projections. In the case of silicon dioxide on epitaxial silicon, aqueous potassium hydroxide may be used; it etches silicon at a rate of about 1.5 micrometers per minute and silicon dioxide at a rate of 0.01 micrometers per minute. The rate of etching is dependent on both the temperature of the etching solution and its concentration. The concentration of the aqueous potassium hydroxide solution may range from 2 to 12 molar; outside these limits, the rate of etching decreases to an unacceptable level.

For the practice of the invention, it is convenient to maintain the solution at elevated temperatures. Since the etch rate increases as the temperature of the solution increases, temepratures greater than 70° C. give reasonable times of etching. However, the temperature employed is also constrained at the upper limit by boiling of the solution.

Other etchants for the silicon-silicon dioxide system include aqueous solutions of hydrazine and of ethylene diamine plus catechol. The useful concentration range of the former solution may vary from 5 to 25 molar, while that of the latter from 5 to 15 molar of ethylene diamine and 0.1 to 1 molar of catechol. The practical lower temperature limit of the hydrazine solution is 90° C., while that of the ethylene diamine-catechol solution is 80° C.

An etching time of from 12 to 25 minutes is usually sufficient to ensure substantially complete removal of all projections from the surface, regardless of the etchant used.

(f) Other considerations.—While the above sequence of steps is sufficient for the practice of the invention, it is necessary, and thus preferable, to repeat steps (b) through (d), inclusive, at least once, and to remove only part of the oxide layer each time. It will be recalled that the pinholes, which are generated by preparing the etchant-resist film sufficiently thin, occur primarily at the site of the projections. In addition, however, a large number of pinholes also occur at random across the surface. Thus, etching the oxide from the projections completely would, at the same time, result in thousands of pinholes through the oxide surface itself. The existence of these pinholes would then have the potential effect of leading to subsequent extensive damage of the epitaxial layer during the etching of the projections. Therefore, by repeating steps (b) through (d) and removing only part of the oxide each time, the result will be that following one complete sequence of processing, only part of oxide thus exposed will also be removed, thereby also forming thousands of depressions in the oxde layer. By removing the etchant-resist film and spinning on a new film, these depressions will fill up with the film. Yet, again, pinholes will preferably be generated at the sites of projections. While again there will also be large numbers of pinholes randomly distributed across the surface, they will not tend to occur at the sites of the previously random pinholes. As a consequence, the only sites where the oxide will be completely etched away following the repetition of the sequence will be at the sites of the projections.

From less than 1 to over 600 projections per square centimeter have been observed on epitaxial silicon deposited on silicon wafers. In the practice of the prescribed process with one repetition, less than 1 hole per square millimeter in the epitaxial silicon layer has been observed.

(2) The figures

Referring to the drawing, FIG. 1 shows a wafer 10 comprised of a substrate 11 on which a layer 12 has been epitaxially deposited. As a result of the epitaxial deposition process, projections 13, rising above the surface, occur.

Figure 2:
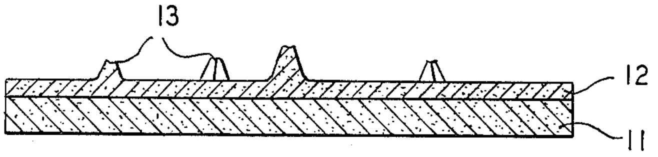
FIGS. 2 through 5 schematically represent a cross-section of the wafer during four separate steps of processing.

FIGS. 2 through 5 are a cross-section of the wafer along the direction 2—2; FIG. 2 shows the wafer 10 described in FIG. 1, prior to the processing steps in accordance with the invention.

Figure 3:
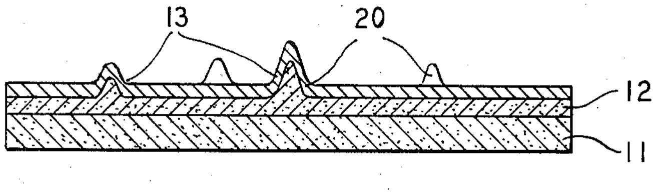
Figure 4:
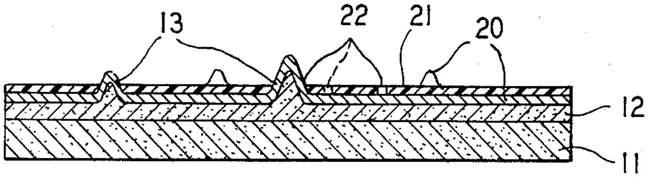
Figure 5:
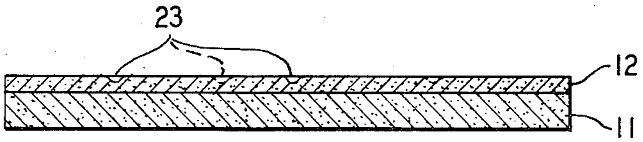

FIG. 3 illustrates an oxide layer 20 as produced on the surface of the epitaxial layer 12 and the projections 13. The preferred thickness of the oxide layer is from 0.2 to 0.5 micrometer. An etchant-resist film 21, having a preferred thickness of about 0.1 micrometer, is now deposited over the oxide layer 20 ,as shown in FIG. 4. The pinholes, or discontinuities, 22 are statistically generated at the sites of the oxide-covered projections, thereby exposing them, while the rest of the surface is substantially protected by the etchant-resist film 21. The discontinuities 22, however, may also occur at random across the surface of the etchant-resist film 21. A preferred method for depositing the discontinuous etchant-resist film 21 over the oxide 12 is to apply a few drops of a dilute (about 3 to 4 centipoises) liquid solution of the film (not shown) to the surface of the oxide layer. The wafer 10 is then spun on its axis at a rate of from 8,000 to 10,000 revolutions per minute for from 10 to 16 seconds (assuming a wafer diameter of 30 to 50 millimeters).

The buffered hydrofluoric acid solution, mentioned earlier, is then used to etch away the oxide over the projections. As an example of the composition of this solution, 40 grams of ammonium fluoride is dissolved in 60 milliliters of water. To 100 milliliters of this stock solution, 15 milliliters of 49 percent hydrofluoric acid in water is added. The pH is maintained at about 2.0 by use of the stock solution.

Next, the etchant-resist film is removed in a common organic solvent, such as acetone or n-butyl acetate. The wafer is then exposed to an etchant that will attack the exposed projections relative to the oxide remaining on the surface. In the case of epitaxially-deposited silicon with a protective coating of silicon dioxide on the surface, a preferred etchant is a 5 molar solution of potassium hydoxide, maintained at 85° C.

Once the removal of the projections is complete, the removal of the oxide layer is accomplished by techniques well known in the art, as for example, by use of the buffered hydrofluoric acid solution described above. A cross-section of the surface, following the procedure in accordance with the inveniton, has the appearance shown in FIG. 5, where depressions 23 now exist in sites formerly occupied by the projections. The wafers can now be processed in the manner usual for the producition of circuitry, and so forth, as is customarily practiced in the art.

(3) Description of the preferred embodiment

An example is given below to aid the practitioner in the application of the invention. While the example is given in terms of epitaxially-deposited silicon and a particular etchant-resist, it should be noted that the invention is not restricted to these but rather is applicable to the removal of projections on any film generated during its growth using any available etchant-resist that can be prepared thin enough to generate discontinuities that will thereby preferably expose such projections.

Epitaxially-deposited silicon on silicon wafers (having diameters of about 30 millimeters) have been processed as follows:

(A) A film of silicon dioxide, 0.5 micrometer thick, was grown on the surface of an epitaxially-deposited silicon layer. Exposure to an atmosphere of steam at a temperature of 1100° C. for 32 minutes [(100) orientation] or 36 minutes [(111) orientation] was sufficient to do this.

(B) Two drops of a dilute solution of poly(vinyl cinnamate), having a viscosity of 3.5 centipoises were spun onto the oxide surface at 9000 revolutions per minute for 15 seconds, thereby producing a polymeric film about 0.1 micrometer thick.

(C) After a 10 minute air dry, the wafer was immersed in an aqueous hydrofluoric acid solution, buffered to a pH of 2.0 with ammonium fluoride, for 2.5 minutes to etch 50 percent of the thickness of the silicon dioxide film.

(D) The etchant-resist film was removed by immersion of the wafer in acetone for 3 minutes, followed by a 3 minute rinse in de-ionized water.

(E) Steps B through D were repeated once.

(F) The surface of the wafer was etched in 5 molar potassium hydroxide at 85° C. for 24 minutes, thereby removing substantially all projections. The wafer was then rinsed in de-ionized water for 3 minutes.

(4) Results

One hundred wafers, including both (100) and (111) oriented surfaces, were processed using the procedure outlined above. Microscopic examination of the wafers before and after treatment indicated that more than 90 percent of all measurable projections were eliminated; yet very little damage to the epitaxially-deposited silicon layer itself resulted. Far less than one hole per square millimeter in the epitaxially-deposited silicon layer could be ascribed to random holes in the etchant-resist film.

Prior to use of this procedure, nearly 22 percent of photomasks inspected were rejected for scratches and other damage caused by the presence of projections. Following use of this procedure, the rejection rate dropped to about 2.5 percent.

What is claimed is:

1. The method of removing projections from the surface of semiconductor layers epitaxially deposited onto substrates, characterized in that an oxide is produced on said surface, including said projections, to form an oxided surface, said oxide being of a thickness of from 0.05 to 1.0 micrometers ($10^{-6}$ meters) and in that said surface is subjected to the following sequence of steps at least once:

(a) said oxided surface is coated with a film resistant to chemical etching to form a coated surface by depositing said film from a solution onto said oxided surface, said solution ranging in viscosity of from 1 to 4 centipoises and said film having a maximum thickness of 0.3 micrometer, whereby said film evidences discontinuities, said discontinuities baring essentially all of said projections, and (b) said coated surface is contacted by a first etchant that selectively attacks said oxide relative to said film, thereby removing said oxide over said projections to expose uncoated semiconductor material, following which sequence said coated surface is contacted by a second etchant that attacks the uncoated semiconductor material relative to the remaining exposed surface whereby said projections are selectively removed.

2. The method of claim 1, in which prior to being wetted by said second etchant, said coated surface is wetted by a solvent that removes said film.

3. The method of claim 2, in which said sequence of steps is followed at least twice.

4. The method of claim 1 in which said epitaxial layer consists essentially of silicon.

5. The method of claim 1 in which the thickness of said oxide ranges from 0.2 to 0.5 micrometer.

6. The method of claim 1 in which said film resistant to chemical etching consists essentially of an organic polymer.

7. The method of claim 6 in which said film has a maximum thickness of 0.1 micrometer.

8. The method of claim 7 in which said film is one selected from the group consisting of polyvinyl cinnamate resins, polyisoprene plus diazido resins, and polar phenolic type resins plus orthoquinone-diazides.

References Cited

UNITED STATES PATENTS

| | | | |
|---|---|---|---|
| 3,107,188 | 10/1963 | Hancock | 156—17 |
| 3,506,506 | 4/1970 | Pennebaker | 156—3 |

JACOB STEINBERG, Primary Examiner

U.S. Cl. X.R.

148—175; 156—11

UNITED STATES PATENT OFFICE

CERTIFICATE OF CORRECTION

Patent No. 3,718,514 Dated February 27, 1973

Inventor(s) William C. Erdman and Paul Miller

It is certified that error appears in the above-identified patent and that said Letters Patent are hereby corrected as shown below:

Column 1, line 41, "($10^{-6}$ meters" should read --($10^{-6}$ meters)--.

Column 2, line 44, "enough" should read --thick enough--;

line 54, "10" should read --18--;

line 72, "silicon oxide" should read --silicon dioxide--.

Column 3, line 41, "ot" should read --to--;

line 43, "ot" should read --to--.

Column 4, line 42, "temepratures" should read --temperatures--.

Column 5, line 71, "producition" should read --production--.

Signed and sealed this 10th day of July 1973.

(SEAL)
Attest:

EDWARD M.FLETCHER,JR.
Attesting Officer

Rene Tegtmeyer
Acting Commissioner of Patents